(12) United States Patent
Kirsch

(10) Patent No.: US 7,023,751 B2
(45) Date of Patent: *Apr. 4, 2006

(54) METHOD AND CIRCUIT FOR REDUCING DRAM REFRESH POWER BY REDUCING ACCESS TRANSISTOR SUB THRESHOLD LEAKAGE

(75) Inventor: Howard C. Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/040,959

(22) Filed: Jan. 19, 2005

(65) Prior Publication Data

US 2005/0141309 A1 Jun. 30, 2005

Related U.S. Application Data

(63) Continuation of application No. 10/231,626, filed on Aug. 29, 2002, now Pat. No. 6,888,769.

(51) Int. Cl.
*G11C 7/00* (2006.01)

(52) U.S. Cl. .................. 365/205; 365/189.09; 365/177
(58) Field of Classification Search ................ 365/205, 365/189.09, 177
See application file for complete search history.

(56) References Cited

U.S. PATENT DOCUMENTS

| | | | |
|---|---|---|---|
| 4,679,172 A | 7/1987 | Kirsch et al. | 365/222 |
| 4,984,207 A | 1/1991 | Tateno et al. | 365/208 |
| 4,994,688 A | 2/1991 | Horiguchi et al. | 307/296.8 |
| 5,257,238 A | 10/1993 | Lee et al. | 365/230.06 |
| 5,491,655 A * | 2/1996 | Hirose et al. | 365/177 |
| 5,523,713 A | 6/1996 | Yukutake et al. | 327/411 |
| 5,526,313 A | 6/1996 | Etoh et al. | 365/205 |
| 5,539,703 A | 7/1996 | Manning | 365/222 |
| 5,706,236 A * | 1/1998 | Yamamoto | 365/205 |
| 5,798,976 A | 8/1998 | Arimoto | 365/222 |
| 5,869,874 A | 2/1999 | Manning | 257/382 |
| 5,880,604 A | 3/1999 | Kawahara et al. | 326/83 |
| 5,909,630 A | 6/1999 | Roberts et al. | 438/452 |
| 5,910,924 A | 6/1999 | Tanaka et al. | 365/226 |

(Continued)

*Primary Examiner*—Huan Hoang
(74) *Attorney, Agent, or Firm*—Dorsey & Whitney, LLP

(57) ABSTRACT

The required refresh rate of a DRAM is reduced by biasing active digit lines to a slight positive voltage to reduce the sub threshold current leakage of access transistors in memory cells that are not being accessed. The slight positive voltage is provided by a voltage regulator circuit using one or more bipolar transistors fabricated in a well that electrically isolates the bipolar transistors from the remainder of the substrate. The voltage provided by the voltage regulator is preferably coupled to the access transistors by powering each of the n-sense amplifiers in the DRAM with the voltage from the voltage regulator.

43 Claims, 10 Drawing Sheets

U.S. PATENT DOCUMENTS

| | | |
|---|---|---|
| 5,999,460 A | 12/1999 | Oh .............................. 365/205 |
| 6,159,813 A | 12/2000 | Ahmad et al. .............. 438/305 |
| 6,191,448 B1 | 2/2001 | Forbes et al. ............... 257/330 |
| 6,208,575 B1 | 3/2001 | Proebsting .................. 365/208 |
| 6,306,727 B1 | 10/2001 | Akram ....................... 438/444 |
| 6,317,357 B1 | 11/2001 | Forbes ....................... 365/149 |
| RE37,593 E | 3/2002 | Etoh et al. ............. 365/189.09 |
| 6,373,753 B1 | 4/2002 | Proebsting ............. 365/189.09 |
| 6,410,378 B1 | 6/2002 | Gonzalez .................... 438/217 |
| 6,429,065 B1 | 8/2002 | Forbes ....................... 438/238 |
| 6,456,157 B1 | 9/2002 | Forbes et al. ............... 327/543 |
| 6,462,584 B1 | 10/2002 | Proebsting ................... 327/52 |
| 6,468,855 B1 | 10/2002 | Leung et al. ............... 438/239 |
| 6,535,435 B1 | 3/2003 | Tanaka et al. ......... 365/189.09 |
| 6,556,068 B1 | 4/2003 | Forbes et al. ............... 327/537 |
| 6,636,075 B1 | 10/2003 | Nakayama et al. ......... 326/102 |
| 6,674,672 B1 | 1/2004 | Forbes et al. .......... 365/189.09 |
| 6,677,658 B1 | 1/2004 | Akram ....................... 257/513 |

\* cited by examiner

METHOD AND CIRCUIT FOR REDUCING DRAM REFRESH POWER BY REDUCING ACCESS TRANSISTOR SUB THRESHOLD LEAKAGE

CROSS-REFERENCE TO RELATED APPLICATION

This application is a continuation of U.S. patent application Ser. No. 10/231,626, filed Aug. 29, 2002, now U.S. Pat. No. 6,888,769.

TECHNICAL FIELD

The invention relates dynamic random access memory ("DRAM") devices, and, more particularly, to a circuit and method for reducing the sub threshold current leakage through DRAM access transistors thereby reducing the required refresh rate.

BACKGROUND OF THE INVENTION

The power consumed by integrated circuits can be a critical factor in their performance in certain applications. For example, the power consumed by memory devices used in portable personal computers greatly affects the length of time they can be used without the need to recharge batteries powering such computers. Power consumption can also be important where memory devices are not powered by batteries because it may be necessary to limit the heat generated by the memory devices.

In general, the power consumption of memory devices increases with both the capacity and the operating speed of memory devices. The power consumed by memory devices is also affected by their operating mode. A dynamic random access memory ("DRAM"), for example, will generally consume a relatively large amount of power when the memory cells of the DRAM are being refreshed. During a refresh of a DRAM, rows of memory cells in a memory cell array are being actuated in rapid sequence. Each time a row of memory cells is actuated, a pair of digit lines for each memory cell are switched to complementary voltages and then equilibrated, thereby consuming a significant amount power. As the number of columns in the memory cell array increases with increasing memory capacity, the power consumed in actuating each row increases accordingly. Power consumption also increases with increases in the rate at which the rows of memory cells are actuated. Thus, as the operating speed and capacity of DRAMs continues to increase, so also does the power consumed by DRAMs continue to increase during refresh.

The refresh power consumption of a DRAM is directly proportional to the refresh rate required to maintain voltages stored in memory cell capacitors within a range in which the voltages can be accurately determined by sense amplifiers. Therefore, if the required refresh rate for a DRAM could be reduced, so also could the refresh power consumption.

With reference to FIG. 1, a portion of a typical DRAM array 100 includes a plurality of memory cells 110, each of which is coupled to a word line WL and a digit line DL. The memory cells 110 in the array 100 are arranged in rows and columns, with a word line being provided for each row of memory cells 100. The word lines WL are coupled to and actuated by a row decoder 112 responsive to a row address $A_0$–$A_X$. As shown in FIG. 1, the DRAM array 100 has a folded digit line architecture so that complimentary digit lines DL and DL* are provided for each column of memory cells 110. In a memory array having an open digit line architecture (not shown), a single digit line DL is included in the array for each column of memory cells 110. The other digit line is provided by an adjacent array. However, the following discussion of the problems with DRAM arrays and prior attempts to solve such problems is applicable to arrays having an open digit line architecture as well as arrays having a folded digit line architecture.

Regardless of whether the array has a folded digit line architecture or an open digit line architecture, each memory cell 110 includes a memory cell capacitor 114 coupled between a cell plate 116 and a storage node 118. An access transistor 120 is coupled between the storage node 118 and a digit line DL for the column containing the memory cell 110. The gate of the access transistor 120 is coupled to a word line WL for the row containing the memory cell 110. When a data bit is to be written to the memory cell 110, a voltage corresponding to the data bit, generally either $V_{CC}$ or zero volts, is applied to the digit line DL to which the memory cell 110 is coupled, and the voltage applied to the word line WL is driven high to turn ON the access transistor 120. The access transistor then couples the digit line DL to the capacitor 114 to store the voltage of the digit line DL in the capacitor 114. For a read operation, the digit line DL is first equilibrated to an equilibration voltage, generally to $V_{CC}/2$, and the word line WL is then driven high to turn ON the access transistor 120. The access transistor 120 then couples the capacitor 114 to the digit line DL to slightly alter the voltage on the digit line DL above or below the equilibration voltage depending upon the voltage stored in the capacitor 114. An n-sense amplifier 130 and a p-sense amplifier 132 sense whether the voltage has increased or decreased responsive to applying an active low NSENSE* signal of normally zero volts to the n-sense amplifier 130 and applying an active high PSENSE signal of normally $V_{cc}$ to the p-sense amplifier 132. The NSENSE* signal and the PSENSE signal are supplied by control circuitry (not shown) in a DRAM. If a voltage increase was sensed, the p-sense amplifier 132 drives the digit line DL to $V_{CC}$, and, if a voltage decrease was sensed, the n-sense amplifier 130 drives the digit line DL to zero volts. The voltage applied to the digit line DL by the sense amplifiers 130, 132 then recharges the capacitor 114 to the voltage to which it was originally charged. A column decoder 136 couples one of the pairs of complimentary digit lines DL, DL* to complimentary input/output lines IO, IO* responsive to a column address $A_0$–$A_Y$.

The above-described memory read process of activating a word line WL and then sensing the digit line voltage of all memory cells 100 in the row for the active word line WL is what is done to refresh the memory cells 100. If the voltage on the capacitor 114 has been excessively discharged from $V_{CC}$ or excessively charged from zero volts between refreshes, it can be impossible for the sense amplifiers 130, 132 to accurately read the voltage to which the memory cell capacitor 114 was charged. The result is an erroneous reading of the memory cell 100 known as a data retention error.

As is well known in the art, the charge placed on a memory cell capacitor 114 dissipates through a variety of paths. One discharge path is through the dielectric of the capacitor 114 itself. Another significant discharge path is through the access transistors 120 coupling the capacitors 114 to the digit lines DL when the transistors 120 are turned OFF. This leakage current is known as the "sub-threshold" leakage current of the transistors 120. Reducing the sub-threshold leakage current of the access transistors 120 allows the capacitor 114s to retain a voltage that is close enough to the voltage initially placed on the capacitors 114 for a data retention error to be avoided.

Various approaches have been used to reduce the sub-threshold leakage of the access transistors 120 to allow memory cell capacitors 114 to retain charge for a longer period between refreshes. Some of these approaches rely on increasing the threshold voltage $V_T$ of the access transistor 120. As is well known in the art, the threshold voltage $V_T$ is the gate-to-source voltage at which the transistor 120 begins to turn ON so that it can readily conduct current. However, the value of the gate-to-source voltage in relation to the threshold voltage $V_T$ also determines the amount of sub threshold leakage through the access transistor 120 when the transistor 120 is OFF. For example, for a given gate-to-source voltage, an access transistor 120 having a threshold voltage $V_T$ of 0.8 volts will conduct less current than an access transistor 120 having a threshold voltage $V_T$ of 0.6 volts. Also, for a given threshold voltage $V_T$, an access transistor 120 having a gate-to-source voltage of –0.5 volts will conduct less current than an access transistor 120 having a gate-to-source voltage of 0 volts.

An important parameter affecting the threshold voltage $V_t$ an access transistor 120 is the voltage of the substrate in which the transistor 120 is fabricated. Making the substrate more negative increases the threshold voltage $V_T$ for a given gate-to-source voltage. In the past, the substrate in which DRAMs are fabricated has been biased to a negative voltage, generally by using a negative voltage charge pump (not shown). While this approach successfully reduces the sub-threshold leakage current of the access transistors 120 and consequently reduces the required refresh rate, it creates other problems for the DRAMs. For example, since charge pumps are inherently very inefficient in converting one voltage to another, the need for a charge pump can unduly increase the power consumption of a DRAM. Also, negatively biasing the entire substrate in which the DRAM is fabricated can cause other circuitry, such as output buffers for the DRAM, to "lock up" and pull the voltage of the substrate to a positive voltage, such as $V_{CC}$. When this happens, the DRAM becomes inoperative.

The disadvantages of negatively biasing the entire substrate for the DRAM have been addressed by electrically isolating the substrate for the memory array from the substrate for the remaining circuitry in the DRAM, and then negatively biasing only the substrate for the memory array. Although this approach does reduce the power consumed by a negative voltage charge pump and does prevent other circuitry from being affected by the negative substrate voltage, it creates other problems. With reference to FIG. 2, a "triple well" 140 is normally used to isolate the memory array from the remaining circuitry in the DRAM. When formed in a p-type substrate 144, for example, the triple well 140 is formed by a buried n-type layer 146 normally formed by ion implantation, and two relatively deep and narrow n-wells 148, 150 extending from the surface of the substrate 144 to the layer 146. A p-well 154 is thereby formed in the triple well 140, and an array 156 of memory cells are fabricated in the p-well 154. Other circuitry 158 in the DRAM is fabricated in the substrate 144 outside of the p-well 154 so that the circuitry is electrically isolated from the p-well 154 by the triple well 140. The p-well 154 is biased to a negative voltage by suitable means, such as a charge pump (not shown), to reduce the sub-threshold leakage current of the access transistors 120, and the substrate 144 is biased to zero volts simply by coupling the substrate to a ground terminal.

Although the triple well 140 shown in FIG. 2 does provide the advantages of a low sub-threshold leakage current while avoiding the above-described disadvantages of a negative biasing the entire substrate 144, it has the significant disadvantage of consuming a relatively large area of the substrate 144. More specifically, it is difficult to fabricate the n-wells 148, 150 deeply without the n-wells also spreading out to occupy an undesirably large area of the substrate 144. As a result, DRAMs using this approach must be relatively large, which adversely affects the cost and operating speed of such DRAMs.

As previously explained, the sub-threshold leakage current of the access transistor 120 is determined by the gate-to-source voltage in relation to the threshold voltage $V_T$. Rather than attempting to increase the threshold voltage $V_T$, another approach that has been used is to decrease the gate-to-source voltage when the transistors 120 are OFF. With reference to FIG. 1, the gate-to-source voltage can be decreased by biasing the digit lines DL more positively when the access transistors 120 in one row are turned ON and the access transistors 120 in the remaining rows are turned OFF. As explained above, when a row of memory cells 100 are being read, one of the word lines WL is activated to couple the memory cell capacitors 114 in that row to respective digit lines DL. After the sense amplifiers 130, 132 have sensed the voltage of the capacitors 114, the digit lines DL are held at the sensed voltage for as long as the word line WL is active. This can be a considerable period, e.g., up to 120 MS., because data may be read sequentially from each column of an active row, which can require considerable time. During the time that a digit line DL is held at zero volts by the n-sense amplifier 130, the gate-to-source voltage of the access transistors 120 in all of the other rows is relatively low, since the voltage of the other word lines WL may also be at zero volts. As a result, the sub threshold leakage current from the memory cell capacitors 114 in the inactive rows can be considerable, thereby decreasing the time between refreshes of the memory cells.

One approach to reducing the sub threshold current leakage of the access transistors 120 is to power the n-sense amplifiers 130 with a positive voltage, such as 0.3 volts, instead of zero volts. The n-sense amplifiers 130 then drive the digit lines DL to the positive voltage so that the digit lines DL are never held at zero volts. Prior art techniques using this approach are described in U.S. Pat. No. 4,679,172 to Kirsch et al. and an article by Asakura et al. entitled "A 34 ns 256 Mb DRAM with Boosted Sense-Ground Scheme," 1994 IEEE International Solid State Circuits Conference, pp. 140–41.

Another similar approach makes the gate-to-source voltage of more negative by adjusting the voltage of the word lines WL. The word lines WL are normally driven to a pumped voltage in excess of $V_{CC}$ to turn ON the access transistors 120 and allow them to coupled $V_{CC}$ from the digit lines DL to the memory cell capacitors 114. The word lines WL are normally driven to zero volts to turn OFF the access transistors 120 to isolate the memory cell capacitors 114 from the digit lines DL. Rather than driving the word lines to zero volts to turn OFF the access transistors 120, the word lines can instead be coupled to a negative voltage to turn OFF the access transistors 120. Making the OFF voltage of the word lines WL negative reduces the sub-threshold leakage current of the access transistors, as previously explained, thereby reducing the required refresh rate.

These techniques for reducing the sub-threshold leakage of the transistors 120 by reducing the gate-to-source voltage of the transistors 120 avoid the problems described above encountered by negatively biasing all or a portion of the substrate. However, these techniques create other problems that can impair the performance and/or expense of DRAMs. For example, the technique of biasing the word lines WL to a negative voltage still generally requires the use of a negative charge pump. For the technique of biasing the digit lines to a positive voltage to work well, the bias voltage must be precisely controlled. Unfortunately, it is difficult to achieve precise control of voltages with MOSFET transistors typically used in DRAMs. As a result, this approach to has not met with much practical success.

There is therefore the need for a circuit and method for providing a precisely controlled bias voltage to the digit lines DL of DRAMs to reducing the sub threshold leakage current of access transistors used in the DRAMs. As previously described, reducing the sub threshold leakage current would allow DRAMs to be refreshed at a slower rate, thereby reducing power consumption.

SUMMARY OF THE INVENTION

In accordance with the present invention, an n-sense amplifier is powered with a relatively small positive voltage so that the sense amplifier can maintain digit lines at the positive voltage rather than at zero volts. As a result, the sub threshold leakage current of access transistors in a DRAM is reduced to reduce the required refresh rate of the DRAM. Significantly, the positive voltage is supplied by a voltage regulator using bipolar transistors, which are easily able to provide good regulation of the positive voltage applied to the n-sense amplifier. The bipolar transistor voltage regulator is fabricated in an isolated p-well so that the base voltage of the bipolar transistor can be controlled by controlling the local substrate voltage. The isolated p-well is preferably fabricated by a triple well formed by an n-type implantation and n-type wells in a p-type substrate.

DETAILED DESCRIPTION OF THE INVENTION

Figure 1:
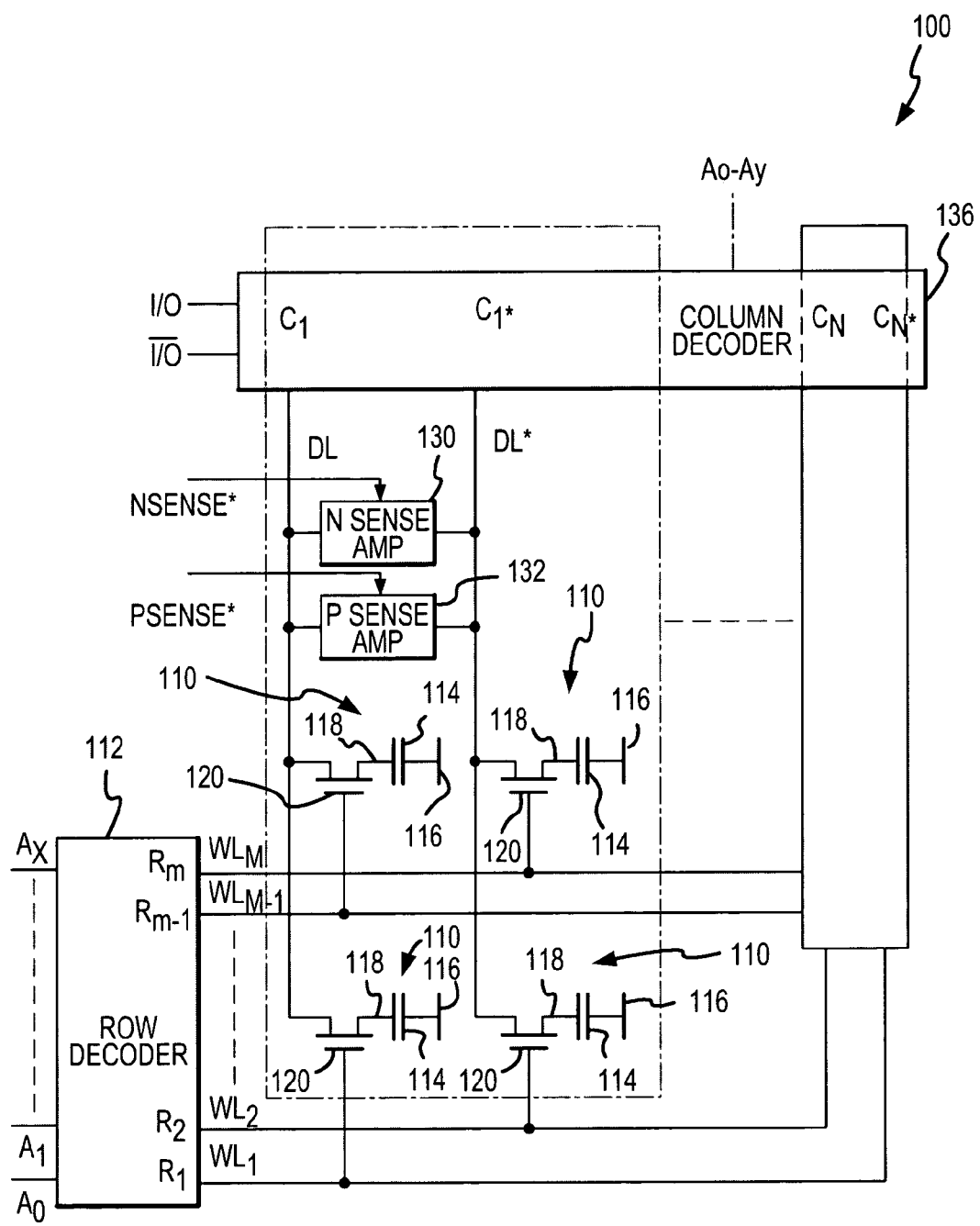
FIG. 1 is a schematic diagram of a portion of a conventional array of memory cells used in a DRAM.
Figure 2:
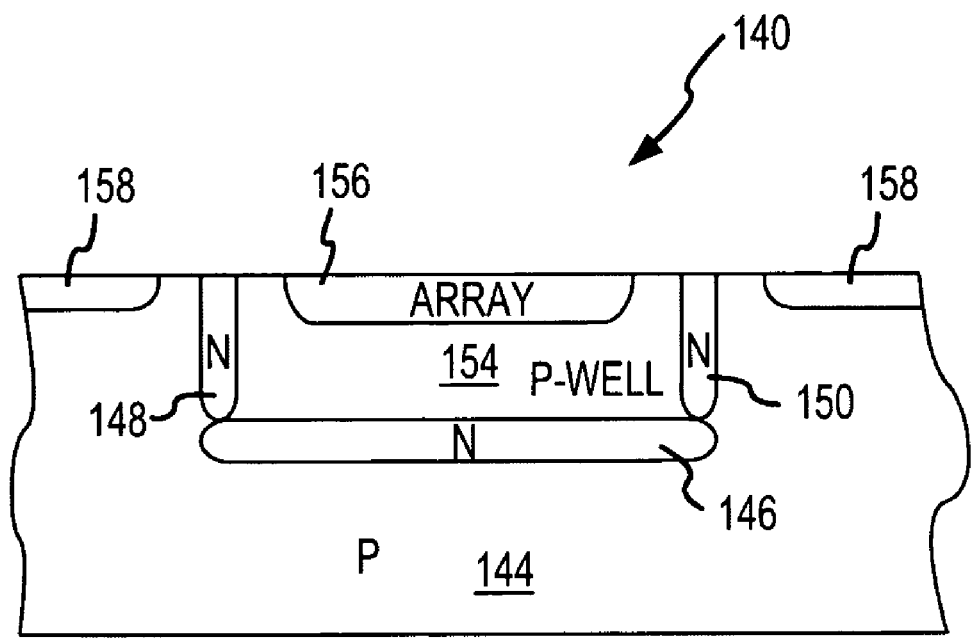
FIG. 2 is a cross-sectional schematic illustration of a triple well structure conventionally used to isolate a memory array from other circuitry in a DRAM.
Figure 3:
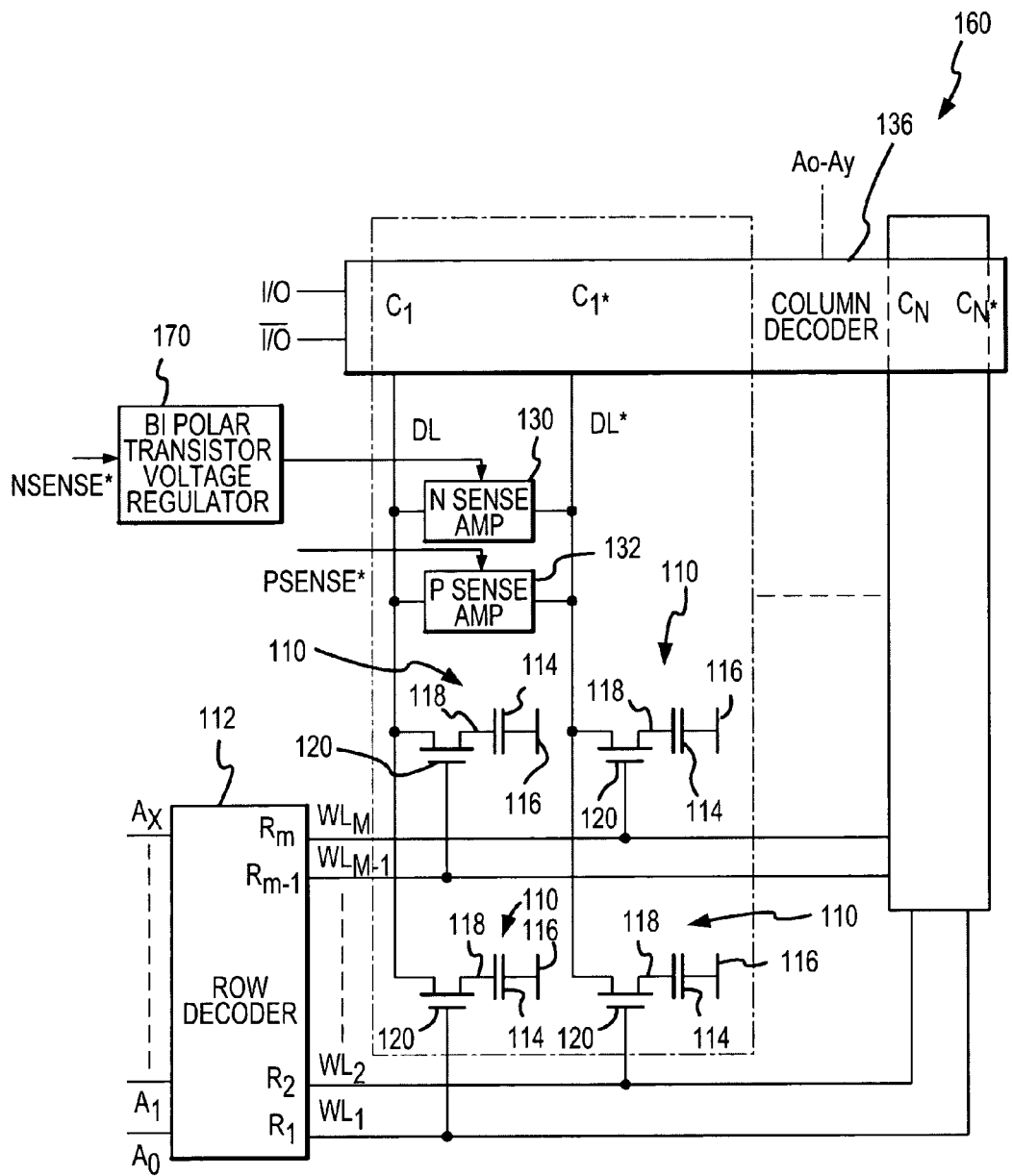
FIG. 3 is a schematic diagram of a portion of an array of memory cells used in a DRAM according to one example of the invention.

A portion of a memory array 160 according to one example of the invention is shown in FIG. 3. The memory array 160 is identical to the memory array 100 shown in FIG. 1, except for differences that will be discussed below. Therefore, in the interest of clarity and brevity, identical components have been provided with the same reference designations, and an explanation of their structure and operation will not be repeated. The memory array 160 differs from the memory array 100 by including a bipolar transistor voltage regulator 170 to provide a small positive voltage $V_{OUT}$ to power the n-sense amplifiers 130 responsive to receiving the NSENSE* signal that is normally applied directly to the n-sense amplifiers. As a result, as previously explained, the n-sense amplifiers 130 drive the digit lines DL to a small positive voltage, rather than zero volts, to decrease the sub threshold leakage currents of the access transistors for the inactive rows. In one example of the invention, the bipolar transistor voltage regulator 170 generates a voltage of 0.3 volts in a DRAM in which $V_{CC}$ is 2 volts. Significantly, by using bipolar transistors in the voltage regulator 170, the voltage regulator is able to provided good regulation of the voltage applied to the n-sense amplifiers 130 despite variations in the load on the voltage regulator 170. The n-sense amplifier 130 is therefore able to provide superior performance in maintaining the voltage it applies to the digit lines DL compared to conventional n-sense amplifier arrangements.

As is well known in the art, when a bipolar transistor is formed by forming n-type regions on the surface of a substrate, the substrate itself becomes the base of the transistor. It is desirable to maintain the voltage of the substrate a constant predetermined voltage, generally zero volts or a slight negative voltage. As a result, it would not be possible to vary the voltage applied to the base of the bipolar transistor. For this reason, bipolar transistors have not been used to generate a slight positive voltage to power n-sense amplifiers.

Figure 4:
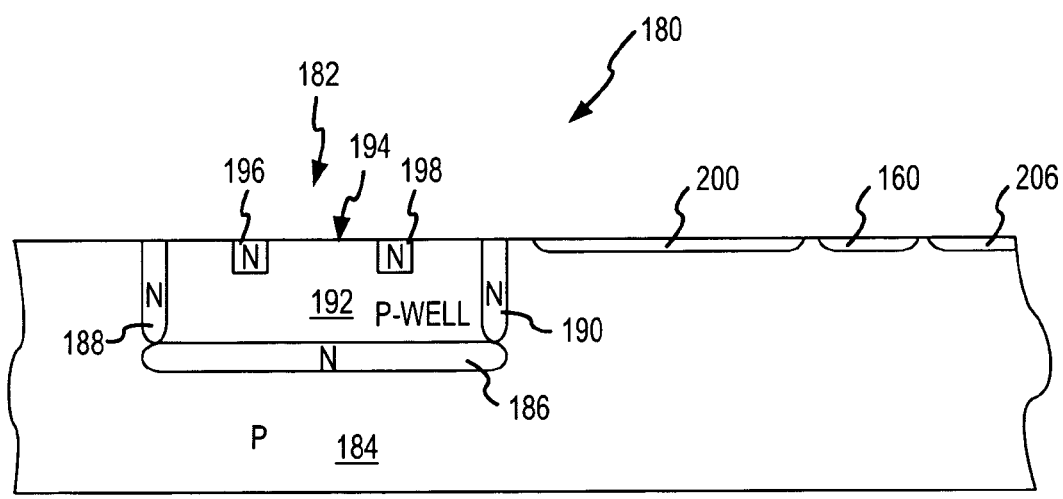
FIG. 4 is a cross-sectional schematic illustration of a semiconductor structure according to one example of the invention in which the bipolar transistor voltage regulator of FIG. 3 is fabricated.

A semiconductor structure 180 in which a DRAM containing the array 160 may be fabricated is shown in FIG. 4. The semiconductor structure 180 includes a triple well 182 formed in a p-type substrate 184 by a buried n-type layer 186, which is preferably formed by ion implantation, and two relatively deep and narrow n-wells 188, 190, which together form a p-well 192. Although the deep n-wells 188, 190 tend to spread out when they fabricated as previously explained, they do not consume a significant amount of area on the substrate 184 because the p-well 192 can be a relatively small size. A bipolar transistor 194 is fabricated in the p-well 192 by fabricating n-type regions 196, 198 in the surface of the p-well 192, which form the emitter and collector of the transistor 194. The p-well 192 thus becomes the substrate for the transistor 194 so that, as described above, the p-well 192 forms the base of the transistor 194. However, since the p-well 192 is isolated from the remainder of the substrate 184, the base voltage can be varied. The p-well 192 and the n-type regions 196, 198 are coupled to other circuitry 200 for the bipolar transistor voltage regulator 170 as well the memory array 160 and as other circuitry 206 for the DRAM, all of which are fabricated in the substrate 184 outside the triple well 182.

Although a triple well 182 is the preferred technique for forming an isolated p-well 192 in a p-type substrate 184, it will be understood that other techniques that can form this structure may also be used.

Figure 5:
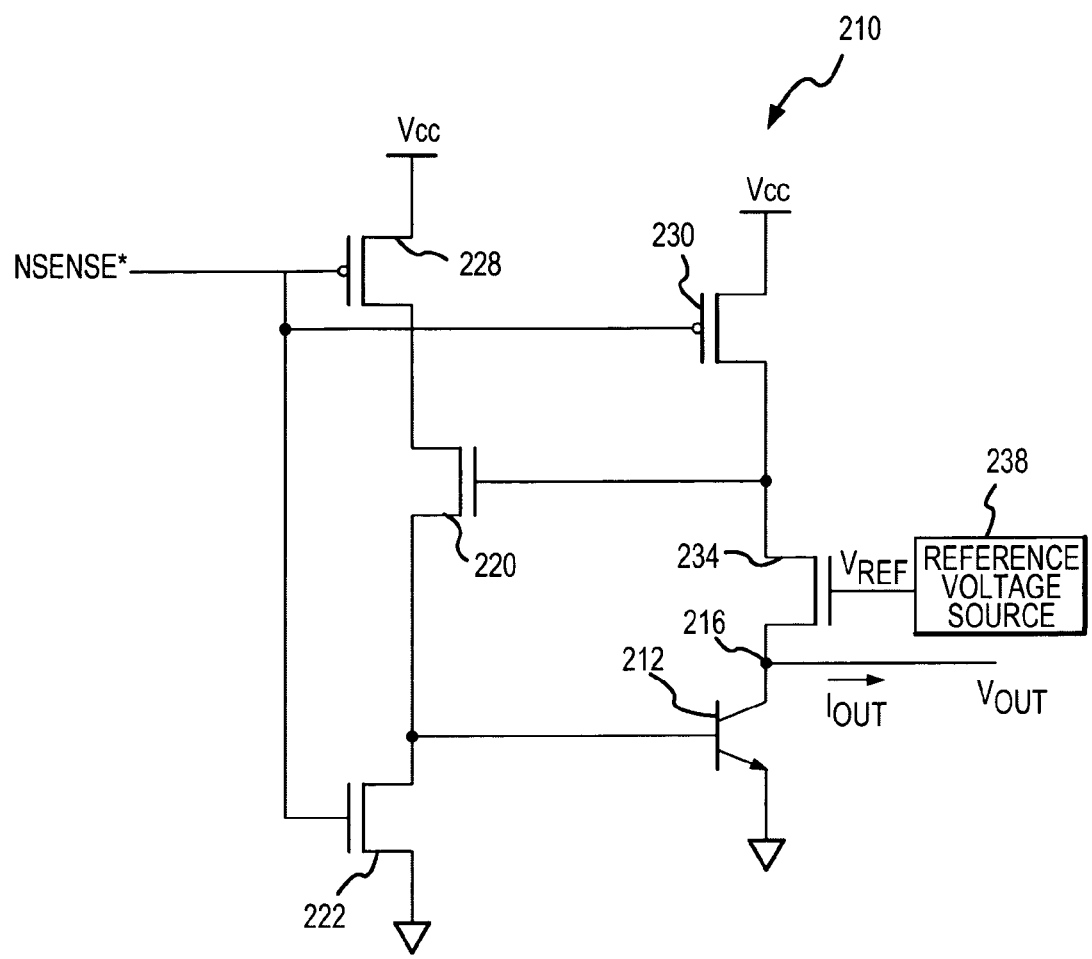
FIG. 5 is a schematic diagram of one example of the bipolar transistor voltage regulator of FIGS. 3 and 4.

One example of a bipolar transistor voltage regulator 210 that can be used as the bipolar transistor voltage regulator 170 in the example of FIG. 3 is shown in FIG. 5. The voltage regulator 210 includes a bipolar NPN transistor 212 that may be fabricated in the p-well 192 shown in FIG. 4. The transistor 212 has its emitter coupled to ground, its collector coupled to an output node 216 to supply the voltage $V_{OUT}$, and its base coupled between the source of a first NMOS transistor 220 and the drain of a second NMOS transistor 222. As explained above, the base of the transistor 212 is formed by the p-well 192. A PMOS transistor 228 is coupled between $V_{CC}$, which may be 2 volts in the example shown in FIG. 5, and the drain of the transistor 220. The gates of the PMOS transistor 228 and the NMOS transistor 222 receive the same active low NSENSE* signal that normally enables the sense amplifier 130 in the prior art array 100 shown in FIG. 1. As explained below, when the NSENSE* signal is active low, the voltage regulator 210 couples a slight positive voltage to the n-sense amplifier 130 (FIG. 3). Another PMOS transistor 230 similarly has its source coupled to $V_{CC}$ and its gate receiving the NSENSE* signal. When the NSENSE* signal is active low, the PMOS transistor 230 couples the supply voltage $V_{CC}$ to an NMOS transistor 234. A voltage reference source 238 of conventional design is coupled to the gate of the transistor 234 to supply a reference voltage $V_{REF}$ to the gate of the transistor 234, which controls the magnitude of the voltage $V_{OUT}$ applied to the output node 216. In the voltage regulator 210 example shown in FIG. 5, the reference voltage $V_{REF}$ is about 1 volt, which, if the NMOS transistor 234 has a threshold voltage $V_T$ of 0.7 volts, results in an output voltage $V_{OUT}$ of 0.3 volts.

In operation, when the NSENSE* signal is inactive high, the high coupled to the gates of the PMOS transistors 228, 230 turns OFF the transistors 228, 230 so that the supply voltage $V_{CC}$ is isolated from the remainder of the circuitry. The inactive high level of the NSENSE* signal also turns ON the NMOS transistor 222 to effectively ground the base of the bipolar transistor 212. The transistor 212 therefore does not conduct any current. As a result, and because the output node 216 isolated from $V_{CC}$, the output node 216 is essentially tri-stated in a high impedance condition. Under these circumstances, the voltage regulator 210 does not supply any power to the n-sense amplifier 130.

When the n-sense amplifier is to be activated for a memory read operation, the NSENSE* signal transitions to active low, thereby turning ON the PMOS transistors 228, 230 and turning OFF the NMOS transistor 222 to allow the base of the bipolar transistor 212 to be driven. Turning ON the PMOS transistor 230 provides a current path from the supply voltage $V_{CC}$ through the NMOS transistors 230, 234. Turning ON the PMOS transistor 228 causes the supply voltage $V_{CC}$ to be coupled to the base of the bipolar transistor 212 through the NMOS transistor 230 so that the transistor 212 can draw current through this current path.

The manner in which the voltage regulator 210 provides a regulated voltage will now be explained. If the current $I_{OUT}$ supplied to the n-sense amplifier 130 responsive to an increased load, that current increase will tend to decrease the voltage $V_{OUT}$. The reduced voltage $V_{OUT}$ increases the gate-to-source voltage of the NMOS transistor 234 since the $V_{REF}$ voltage is fixed, thereby reducing the resistance of the transistor 234. The NMOS transistor 234 forms a voltage divider with the PMOS transistor 230 so that the reduced resistance of the transistor 234 causes the voltage applied to the gate of the transistor 220 to decrease. The gate-to-source voltage of the transistor 220 is thereby reduced so that its resistance increases accordingly. This increased resistance causes less current to flow through the PMOS transistor 228 and the NMOS transistors 220 thereby reducing the base current of the bipolar transistor 212. The bipolar transistor 212 then draws less of the current provided through the NMOS transistor 234 so that more current $I_{OUT}$ is available to meet the increased load of the n-sense amplifier 130. By reducing the current drawn through the bipolar transistor 212 by substantially the magnitude of the increased current drawn by the n-sense amplifier, the transistor 212 returns the voltage $V_{OUT}$ to a voltage that is close to its original value.

The voltage regulator 210 responds to a decrease in current $I_{OUT}$, which would tend to increase the voltage $V_{OUT}$, in a manner that is opposite the manner explained above for an increase in the current $I_{OUT}$.

Figure 6:
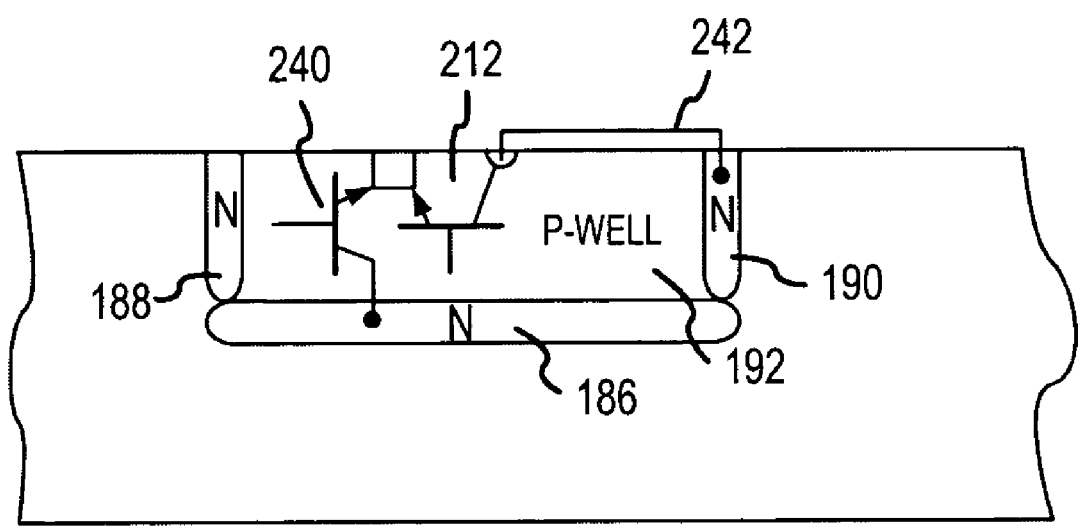
FIG. 6 is a cross-sectional schematic illustration of a semiconductor structure according to another example of the invention schematically showing the bi-polar transistor of FIG. 4.

The n-type region 198 serving as the collector is preferably coupled to the n-well 190 for reasons that will be explained with reference to FIG. 6. As explained above with reference to FIG. 4, the transistor 212 is formed by fabricating n-type regions n-type regions 196, 198 in the surface of the p-well 192, which form the emitter and collector, respectively, of the transistor 194. As also explained, the p-well 192 forms the base of the transistor 194. The resulting transistor 212 is schematically illustrated in FIG. 6 as 212'. However, the above-described structure also inherently forms a parasitic bipolar transistor, which is also schematically illustrated in FIG. 6 as 240. Although this transistor 240 does not have a large current gain, it nevertheless can interfere with the operation of the voltage regulator 170 if its operation is not controlled. By using a conductor 242 to couple the n-type region 198 forming the collector to the n-well 190, this parasitic bipolar capacitor 240 is coupled in parallel with the bipolar transistor 212. While the low performance of the parasitic bipolar capacitor 240 prevents it from substantially improving the performance of the transistor 212, coupling it in parallel with the transistor 212 controls is operation so that it cannot conduct current in an uncontrolled manner.

Figure 7:
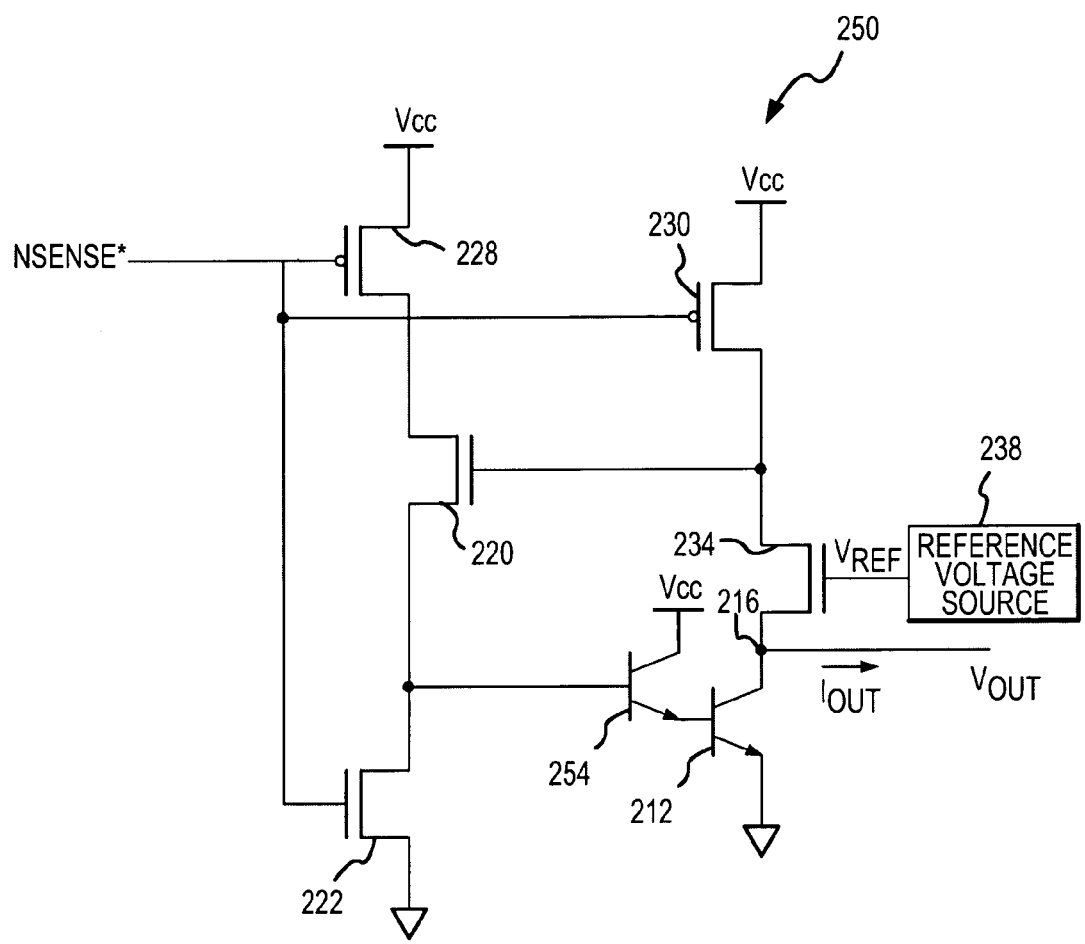
FIG. 7 is a schematic diagram of another example of the bipolar transistor voltage regulator of FIGS. 3 and 4.

Another example of a bipolar transistor voltage regulator 250 that can be used as the bipolar transistor voltage regulator 170 in the example of FIG. 3 is shown in FIG. 7. The voltage regulator 250 is substantially identical to the voltage regulator 210 of FIG. 5 except for the addition of a second bipolar transistor 254. The voltage regulator 250 therefore operates in substantially the same manner, and, in the interest of brevity and clarity, an explanation of its structure and operation will not be repeated. The second bipolar transistor 254 is configured with the bipolar transistor 212 as a "Darlington pair," which, as is well known to those skilled in the art, effectively results in a bipolar transistor with approximately the square of the current gain provided by a single bipolar transistor. The use of two bipolar transistors 212, 254 combined as a Darlington pair thus provides better regulation of the output voltage $V_{OUT}$ responsive to variations in the output current $I_{OUT}$ resulting from varying loads. As with the transistor 212, the second bipolar transistor 254 is fabricated in its own p-well (not shown) in the same manner as the transistor 212.

Figure 8:
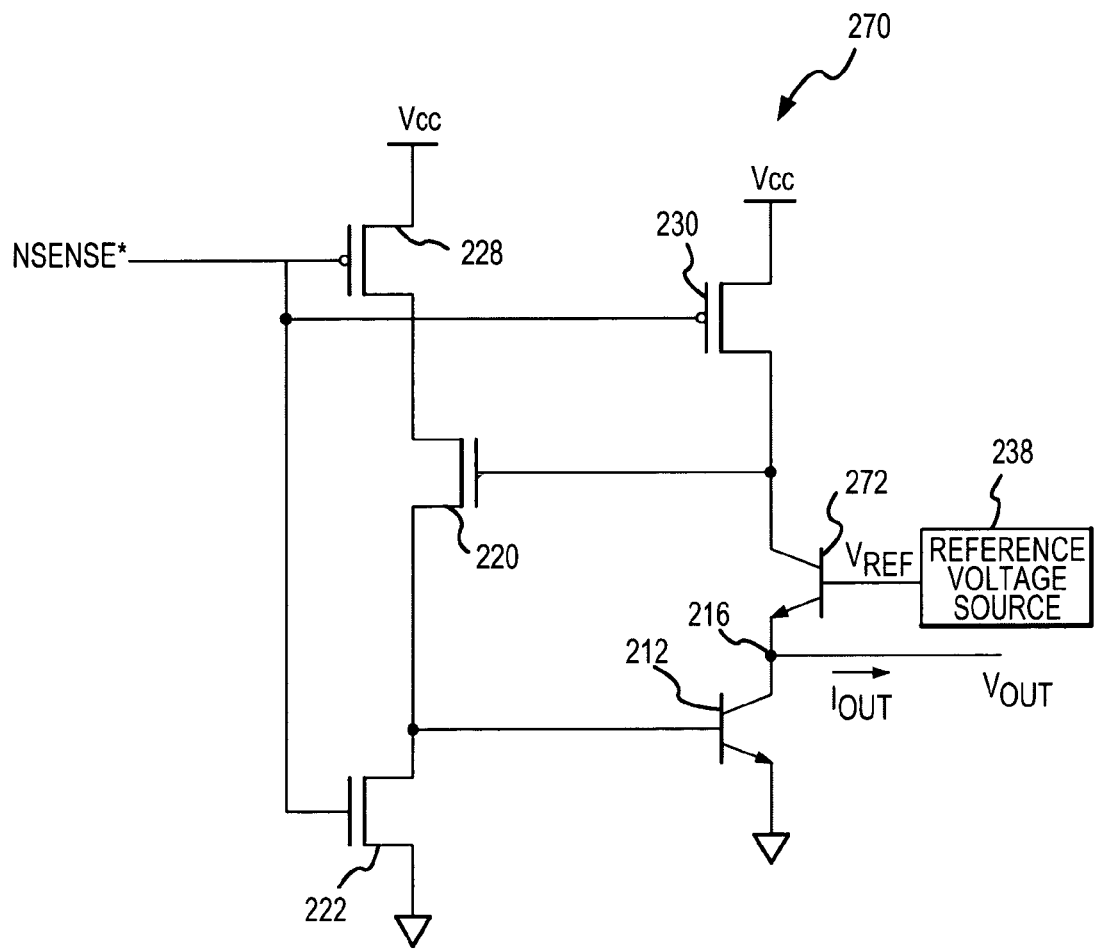
FIG. 8 is a schematic diagram of still another example of the bipolar transistor voltage regulator of FIGS. 3 and 4.

Still another example of a bipolar transistor voltage regulator 270 is shown in FIG. 8. The voltage regulator 270 is substantially identical to the voltage regulator 250 of FIG. 7 and it operates in substantially the same manner. The voltage regulator 270 of FIG. 8 differs from the voltage regulator 250 of FIG. 7 by substituting a third bipolar transistor 272 for the NMOS transistor 234 used in the regulator 250. The bipolar transistor 272 responds to changes in the output current $I_{OUT}$ in substantially the same manner as the NMOS transistor 234. As with the bipolar transistors 212 and 254, the bipolar transistor 272 is fabricated in its own p-well (not shown) in the same manner as the transistors 212, 254.

Figure 9:
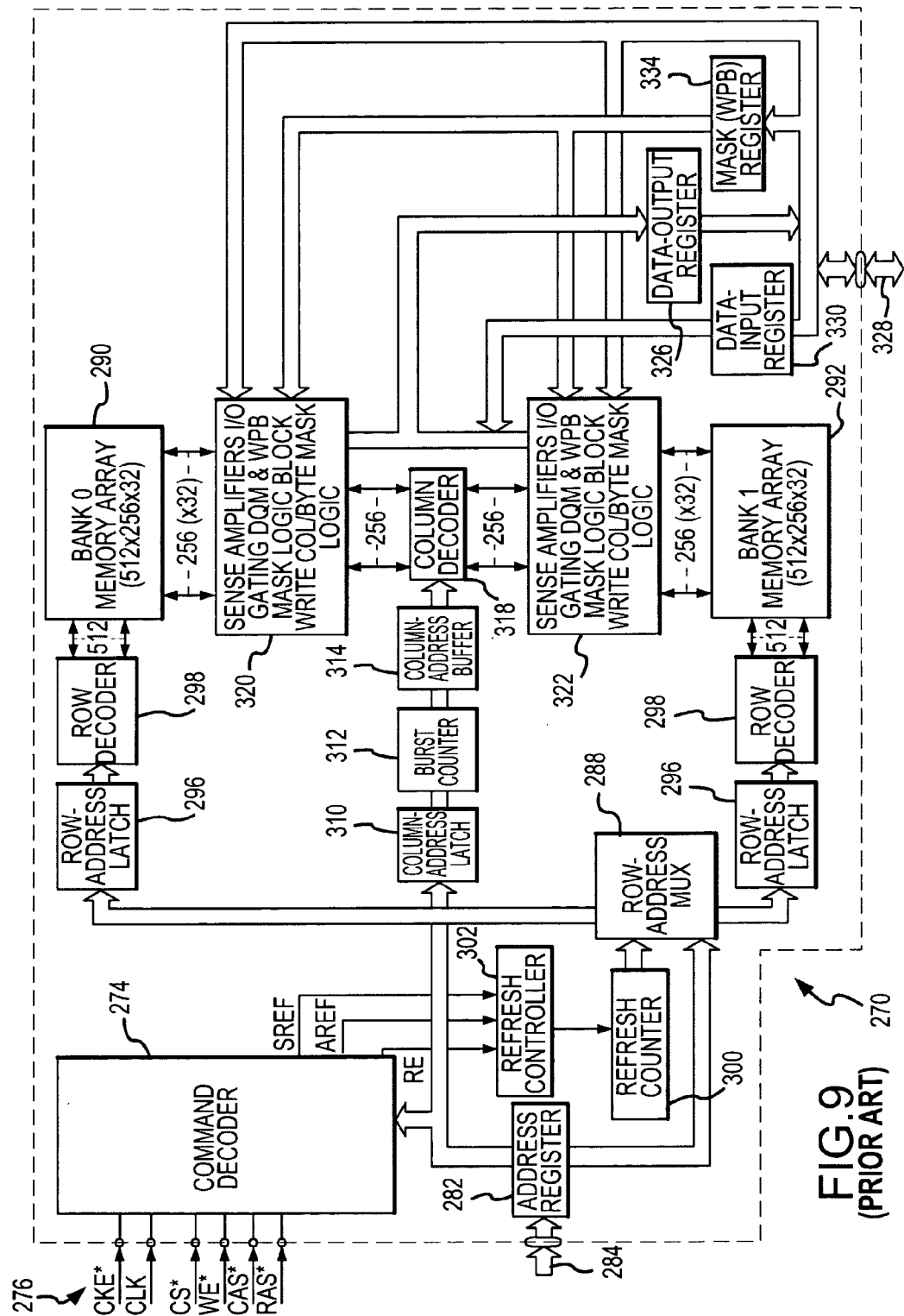
FIG. 9 is a is a block diagram of one example of a memory device using arrays of memory cells as shown in FIG. 3.

FIG. 9 is a block diagram of a conventional synchronous dynamic random access memory ("SDRAM") 270 that can utilize one or more of the voltage regulators described herein or some other voltage regulator in accordance with the present invention. However, it will be understood that various embodiments of the present invention can also be used in other types of DRAMs. The operation of the SDRAM 270 is controlled by a command decoder 274 responsive to high level command signals received on a control bus 276. These high level command signals, which are typically generated by a memory controller (not shown in FIG. 9), are a clock enable signal CKE*, a clock signal CLK, a chip select signal CS*, a write enable signal WE*, a row address strobe signal RAS*, and a column address strobe signal CAS*, in which the "*" designates the signal as active low. The command decoder 274 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these control signals will be omitted.

The SDRAM 270 includes an address register 282 that receives either a row address or a column address on an address bus 284. The address bus 284 is generally coupled to a memory controller (not shown in FIG. 9). Typically, a row address is initially received by the address register 282 and applied to a row address multiplexer 288. The row address multiplexer 288 couples the row address to a number of components associated with either of two memory arrays 290, 292 depending upon the state of a bank address bit forming part of the row address. Associated with each of the memory arrays 290, 292 is a respective row address latch 296, which stores the row address, and a row decoder 298, which decodes the row address and applies corresponding signals to one of the arrays 290 or 292. The arrays 290, 292 use a bipolar transistor voltage regulator 170 or some other bipolar transistor voltage regulator in accordance with the present invention.

The row address multiplexer 288 also couples row addresses to the row address latches 296 for the purpose of refreshing the memory cells in the arrays 290, 292. The row addresses are generated for refresh purposes by a refresh counter 300, which is controlled by a refresh controller 302. The refresh controller 302 is, in turn, controlled by the command decoder 274.

After the row address has been applied to the address register 282 and stored in one of the row address latches 296, a column address is applied to the address register 282. The address register 282 couples the column address to a column address latch 310. Depending on the operating mode of the SDRAM 270, the column address is either coupled through a burst counter 312 to a column address buffer 314, or to the burst counter 312 which applies a sequence of column addresses to the column address buffer 314 starting at the column address output by the address register 282. In either case, the column address buffer 314 applies a column address to a column decoder 318, which applies various column signals to corresponding sense amplifiers and associated column circuitry 320, 322 for one of the respective arrays 290, 292. The column circuitry 320, 322 includes the n-sense amplifiers 130 and the p-sense amplifier 132 as well as a bipolar transistor voltage regulator in accordance with the present invention, including the examples provided herein.

Data to be read from one of the arrays 290, 292 is coupled to the column circuitry 320, 322 for one of the arrays 290, 292, respectively. The data is then coupled to a data output register 326, which applies the data to a data bus 328. Data to be written to one of the arrays 290, 292 are coupled from the data bus 328 through a data input register 330 to the column circuitry 320, 322 where it is transferred to one of the arrays 290, 292, respectively. A mask register 334 may be used to selectively alter the flow of data into and out of the column circuitry 320, 322, such as by selectively masking data to be read from the arrays 290, 292.

Figure 10:
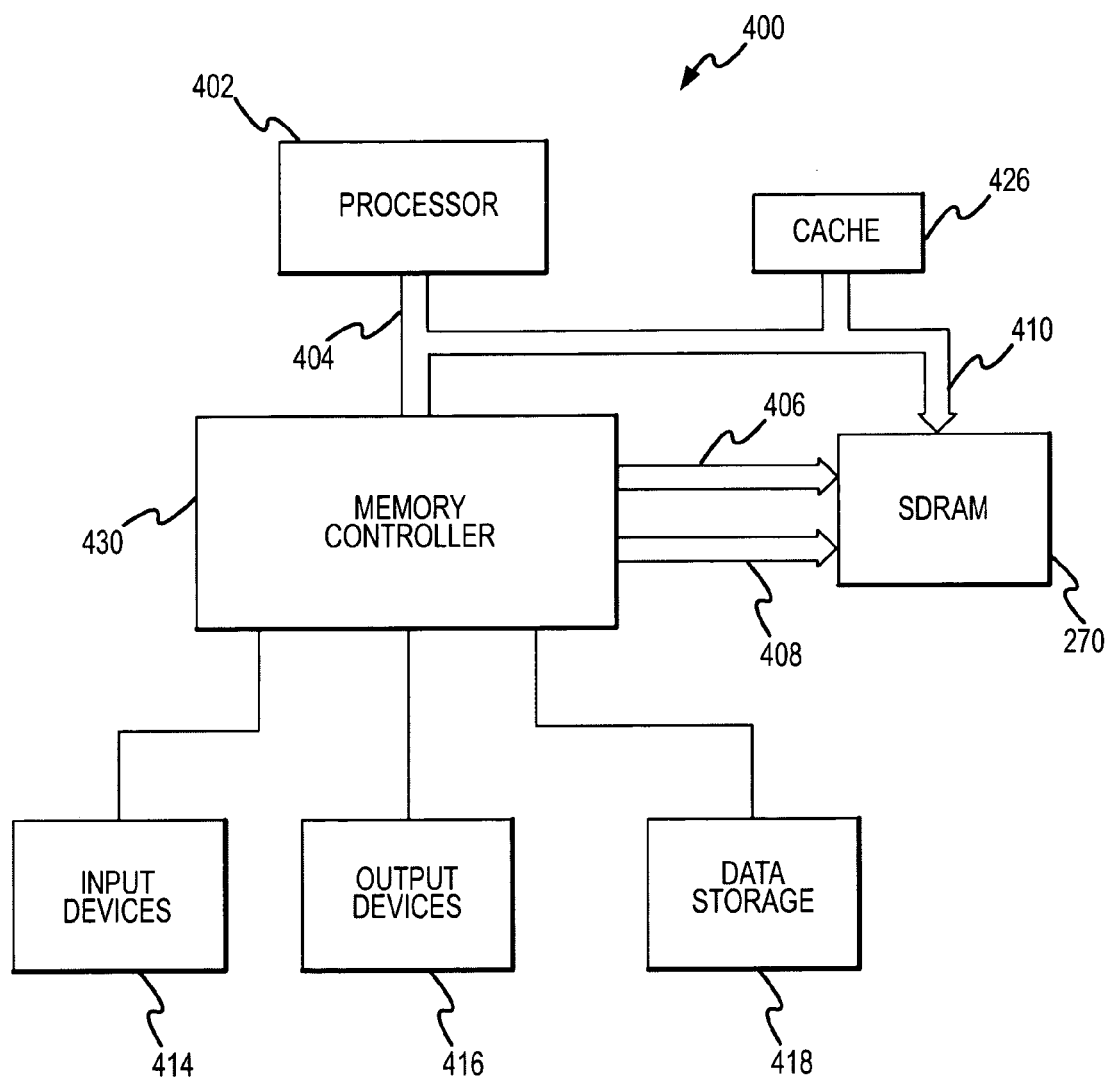
FIG. 10 is a block diagram of a computer system using the memory device of FIG. 9.

FIG. 10 shows an embodiment of a computer system 400 that may use the SDRAM 270 or some other memory device that contains an embodiment of a bipolar transistor voltage regulator as described herein or some other example of a bipolar transistor voltage regulator in accordance with the invention. The computer system 400 includes a processor 402 for performing various computing functions, such as executing specific software to perform specific calculations or tasks. The processor 402 includes a processor bus 404 that normally includes an address bus 406, a control bus 408, and a data bus 410. In addition, the computer system 400 includes one or more input devices 414, such as a keyboard or a mouse, coupled to the processor 402 to allow an operator to interface with the computer system 400. Typically, the computer system 400 also includes one or more output devices 416 coupled to the processor 402, such output devices typically being a printer or a video terminal. One or more data storage devices 418 are also typically coupled to the processor 402 to store data or retrieve data from external storage media (not shown). Examples of typical storage devices 418 include hard and floppy disks, tape cassettes, and compact disk read-only memories (CD-ROMs). The processor 402 is also typically coupled to a cache memory 426, which is usually static random access memory ("SRAM") and to the SDRAM 270 through a memory controller 430. The memory controller 430 includes an address bus coupled to the address bus 284 (FIG. 9) to couple row addresses and column addresses to the SDRAM 270, as previously explained. The memory controller 430 also includes a control bus that couples command signals to a control bus 276 (FIG. 9) of the SDRAM 270. The external data bus 328 (FIG. 9) of the SDRAM 270 is coupled to the data bus 410 (FIG. 10) of the processor 402, either directly or through the memory controller 430. The memory controller 430 applies appropriate command signals to the SDRAM 270 to cause the SDRAM 270 to operate in one or more of the power saving modes described above.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory array, comprising:
   a plurality of memory cells arranged in rows and columns, each of the memory cells including a memory cell capacitor and an access transistor coupled to the memory cell capacitor;
   a digit line for each column of memory cells in the memory array, each digit line being coupled to a plurality of access transistors in a respective column of memory cells;

a word line for each row of memory cells in the memory array, each word line being coupled to the gates of a plurality of access transistors in a respective row of memory cells;

a sense amplifier for each column of memory cells, each sense amplifier being coupled to the digit line for a respective column of memory cells, each sense amplifier being operable to couple a first voltage to the digit line to which the sense amplifier is coupled responsive to sensing a voltage level on the digit line corresponding to a first logic level, and being operable to couple a second voltage to the digit line to which the sense amplifier is coupled responsive to sensing a voltage level on the digit line corresponding to a second logic level, the first voltage being a positive supply voltage and the second voltage being a positive supply voltage having a magnitude that is significantly less than the magnitude of the first voltage; and a voltage regulator coupled to the respective sense amplifiers for a plurality of columns of memory cells, the voltage regulator having at least one bipolar transistor and being operable to supply the first and second voltages to the sense amplifier, the second voltage being supplied using the at least one bipolar transistor.

2. The memory array of claim 1 wherein each of the sense amplifiers comprises:
a p-sense amplifier powered by the first voltage; and
an n-sense amplifier powered by the second voltage.

3. The memory array of claim 2 wherein a pair of complementary digit lines are provided for each column of memory cells, and wherein the p-sense amplifier and the n-sense amplifier for the respective column is coupled to both of the complementary digit lines.

4. The memory array of claim 1 wherein the first logic level comprises a logic "1," and the second logic level comprises a logic "0."

5. The memory array of claim 1 wherein the second voltage is less than 1 volt.

6. The memory array of claim 5 wherein the second voltage is less than 0.3 volts.

7. The memory array of claim 1 wherein the digit lines comprise folded digit lines in which a pair of complimentary digit lines are provided for each column of memory cells in the memory array.

8. The memory array of claim 1 wherein the digit lines comprise open digit lines in which a single digit line is provided for each column of memory cells in the memory array.

9. A dynamic random access memory ("DRAM"), comprising:

a command decoder receiving memory command signals through externally accessible command input terminals, the command decoder generating memory control signals responsive to predetermined combinations of the command signals;

an address decoder receiving address signals through externally accessible address input terminals, the address decoder generating row and column addressing signals responsive to the address signals;

a memory array from which data are read and to which data are written at locations corresponding the address signals responsive to the memory control signals, the memory array comprising:

a plurality of memory cells arranged in rows and columns, each of the memory cells including a memory cell capacitor and an access transistor coupled to the memory cell capacitor;

a digit line for each column of memory cells in the memory array, each digit line being coupled to a plurality of access transistors in a respective column of memory cells;

a word line for each row of memory cells in the memory array, each word line being coupled to the gates of a plurality of access transistors in a respective row of memory cells;

a sense amplifier for each column of memory cells, each sense amplifier being coupled to the digit line for a respective column of memory cells, each sense amplifier being operable to couple a first voltage to the digit line to which the sense amplifier is coupled responsive to sensing a voltage level on the digit line corresponding to a first logic level, and being operable to couple a second voltage to the digit line to which the sense amplifier is coupled responsive to sensing a voltage level on the digit line corresponding to a second logic level, the first voltage being a positive supply voltage and the second voltage being a positive supply voltage having a magnitude that is significantly less than the magnitude of the first voltage; and a voltage regulator coupled to the respective sense amplifiers for a plurality of columns of memory cells, the voltage regulator having at least one bipolar transistor and being operable to supply the first and second voltages to the sense amplifier, the second voltage being supplied using the at least one bipolar transistor; and a data path extending between a plurality of externally accessible data bus terminals and the memory array for coupling data signals to and from the memory array.

10. The DRAM of claim 9 wherein each of the sense amplifiers comprises:
a p-sense amplifier powered by the first voltage; and
an n-sense amplifier powered by the second voltage.

11. The DRAM of claim 10 wherein a pair of complementary digit lines are provided for each column of memory cells, and wherein the p-sense amplifier and the n-sense amplifier for the respective column is coupled to both of the complementary digit lines.

12. The DRAM of claim 9 wherein the first logic level comprises a logic "1," and the second logic level comprises a logic "0."

13. The DRAIVI of claim 9 wherein the second voltage is less than 1 volt.

14. The DRAM of claim 13 wherein the second voltage is less than 0.3 volts.

15. The DRAM of claim 9 wherein the digit lines comprise folded digit lines in which a pair of complimentary digit lines are provided for each column of memory cells in the memory array.

16. The DRAM of claim 9 wherein the digit lines comprise open digit lines in which a single digit line is provided for each column of memory cells in the memory array.

17. A processor-based system, comprising:
an integrated circuit processor having a plurality of externally accessible terminals coupled to a processor bus;
an input device coupled to the processor through the processor bus adapted to allow data to be entered into the computer system;
an output device coupled to the processor through the processor bus adapted to allow data to be output from the computer system; and
a dynamic random access memory coupled to a processor bus, the dynamic random access memory comprising:

a command decoder receiving memory command signals through externally accessible command input terminals, the command decoder generating memory control signals responsive to predetermined combinations of the command signals;

an address decoder receiving address signals through externally accessible address input terminals, the address decoder generating row and column addressing signals responsive to the address signals; and a memory array from which data are read and to which data are written at locations corresponding the address signals responsive to the memory control signals, the memory array comprising:

a plurality of memory cells arranged in rows and columns, each of the memory cells including a memory cell capacitor and an access transistor coupled to the memory cell capacitor;

a digit line for each column of memory cells in the memory array, each digit line being coupled to a plurality of access transistors in a respective column of memory cells;

a word line for each row of memory cells in the memory array, each word line being coupled to the gates of a plurality of access transistors in a respective row of memory cells;

a sense amplifier for each colunm of memory cells, each sense amplifier being coupled to the digit line for a respective column of memory cells, each sense amplifier being operable to couple a first voltage to the digit line to which the sense amplifier is coupled responsive to sensing a voltage level on the digit line corresponding to a first logic level, and being operable to couple a second voltage to the digit line to which the sense amplifier is coupled responsive to sensing a voltage level on the digit line corresponding to a second logic level, the first voltage being a positive supply voltage and the second voltage being a positive supply voltage having a magnitude that is significantly less than the magnitude of the first voltage; and a voltage regulator coupled to the respective sense amplifiers for a plurality of columns of memory cells, the voltage regulator having at least one bipolar transistor and being operable to supply the first and second voltages to the sense amplifier, the second voltage being supplied using the at least one bipolar transistor; and a data path extending between a plurality of externally accessible data bus terminals and the memory array for coupling data signals to and from the memory array.

18. The processor-based system of claim 17 wherein each of the sense amplifiers comprises:

a p-sense amplifier powered by the first voltage; and
an n-sense amplifier powered by the second voltage.

19. The processor-based system of claim 18 wherein a pair of complementary digit lines are provided for each column of memory cells, and wherein the p-sense amplifier and the n-sense amplifier for the respective column is coupled to both of the complementary digit lines.

20. The processor-based system of claim 17 wherein the first logic level comprises a logic "1," and the second logic level comprises a logic "0."

21. The processor-based system of claim 17 wherein the second voltage is less than 1 volt.

22. The processor-based system of claim 21 wherein the second voltage is less than 0.3 volts.

23. The processor-based system of claim 17 wherein the digit lines comprise folded digit lines in which a pair of complimentary digit lines are provided for each column of memory cells in the memory array.

24. The processor-based system of claim 17 wherein the digit lines comprise open digit lines in which a single digit line is provided for each column of memory cells in the memory array.

25. A method of reducing the sub threshold leakage of access transistors in a dynamic random access memory ("DRAM") array fabricated in a semiconductor substrate and having at least one digit line for each column, the access transistors for each column being coupled to the respective at least one digit line for the column, the method comprising:

fabricating at least one bipolar transistor in the semiconductor substrate in a manner that isolates the bipolar transistor from a portion of the semiconductor substrate in which the access transistors are fabricated, the at least one bipolar transistor being part of a voltage regulator circuit that generates a regulated output voltage; and selectively coupling the regulated output voltage to the at least one digit line for each column.

26. The method of claim 25 wherein the DRAM array further comprises a respective sense amplifier for each column coupled to the at least one digit line for the respective column, and wherein the act of selectively coupling the regulated output voltage to the at least one digit line for each column comprises coupling the regulated output voltage to the at least one digit line by using the regulated output voltage to power the sense amplifiers.

27. The method of claim 26 wherein the at least one bipolar transistor includes a collector, and wherein the act of selectively coupling the regulated output voltage to the at least one digit line for each column comprises coupling the collector to respective power inputs for the sense amplifiers.

28. The method of claim 26 wherein the respective sense amplifiers for each column comprise n-sense amplifiers, and wherein the regulated output voltage comprises a positive voltage.

29. The method of claim 28 wherein the regulated output voltage comprises a positive voltage having a magnitude that is substantially less than the magnitude of a positive supply voltage applied to the DRAM array.

30. The method of claim 25 wherein the act of fabricating at least one bipolar transistor in the semiconductor substrate in a manner that isolates the bipolar transistor from a portion of the semiconductor substrate in which the access transistors are fabricated comprises fabricating the at least one bipolar transistor in a well that is fabricated in the semiconductor substrate.

31. The method of claim 25 wherein the act of selectively coupling the regulated output voltage to the at least one digit line for each column comprises coupling the regulated output voltage to the at least one digit line for each column when an access transistor coupled to the respective digit line is non-conductive.

32. The method of claim 25 wherein the act of fabricating at least one bipolar transistor in the semiconductor substrate comprises fabricating two bipolar transistors in the semiconductor substrate and coupling the bipolar transistors to each other as a Darlington pair.

33. A method of supplying power to a plurality of sense amplifiers fabricated in a semiconductor substrate, each of the sense amplifiers being provided for a respective column of an array of dynamic random access memory cells, the sense method comprising:

fabricating at least one bipolar transistor in the semiconductor substrate in a manner that isolates the bipolar transistor from a portion of the semiconductor substrate in which the sense amplifiers are fabricated, the at least one bipolar transistor being part of a voltage regulator circuit that generates a regulated output voltage; and coupling the regulated output voltage to the sense amplifiers.

34. The method of claim 33 wherein the at least one bipolar transistor includes a collector, and wherein the act of coupling the regulated output voltage to the sense amplifiers comprises coupling the collector to respective power inputs for the sense amplifiers.

35. The method of claim 33 wherein the respective sense amplifiers for each column comprise n-sense amplifiers, and wherein the regulated output voltage comprises a positive voltage.

36. The method of claim 33 wherein the regulated output voltage comprises a positive voltage having a magnitude that is substantially less than the magnitude of a positive supply voltage applied to the DRAM array.

37. The method of claim 33 wherein the act of fabricating at least one bipolar transistor in the semiconductor substrate in a manner that isolates the bipolar transistor from a portion of the semiconductor substrate in which the sense amplifiers are fabricated comprises fabricating the at least one bipolar transistor in a well that is fabricated in the semiconductor substrate.

38. The method of claim 33 wherein the act of fabricating at least one bipolar transistor in the semiconductor substrate comprises fabricating two bipolar transistors in the semiconductor substrate and coupling the bipolar transistors to each other as a Darlington pair.

39. In a dynamic random access memory ("DRAM") fabricated in a semiconductor substrate, the DRAM memory having an array of memory cells arranged in rows and columns, the DRAM memory further having at least one digit line for each column of the array, a respective access transistor coupling each of the memory cells to the at least one digit line for the respective column, a respective p-sense amplifier coupled to the at least one digit line for each column of the array, and a respective n-sense amplifier coupled to the at least one digit line for each column of the array, a method of supplying power to the p-sense amplifiers and the n-sense amplifiers so that a sub threshold leakage the access transistors is reduced, the method comprising:

fabricating a well in the semiconductor substrate in a manner that electrically isolates the well from the substrate;

fabricating at least one bipolar transistor in the well, the at least one bipolar transistor being part of a voltage regulator circuit that generates a regulated output voltage;

coupling the regulated output voltage to respective power inputs of the n-sense amplifiers; and coupling a positive voltage having a first magnitude to respective power inputs of the p-sense amplifiers.

40. The method of claim 39 wherein the at least one bipolar transistor includes a collector, and wherein the act of coupling the regulated output voltage to respective power inputs of the n-sense amplifiers comprises coupling the collector to respective power inputs of the n-sense amplifiers.

41. The method of claim 39 wherein the regulated output voltage comprises a positive voltage.

42. The method of claim 41 wherein the regulated output voltage comprises a positive voltage having a magnitude that is substantially less than the first magnitude of the positive voltage that is coupled to the power inputs of the p-sense amplifiers.

43. The method of claim 39 wherein the act of fabricating at least one bipolar transistor in the well comprises fabricating two bipolar transistors in the well and coupling the bipolar transistors to each other as a Darlington pair.

* * * * *

UNITED STATES PATENT AND TRADEMARK OFFICE
CERTIFICATE OF CORRECTION

PATENT NO. : 7,023,751 B2
APPLICATION NO. : 11/040959
DATED : April 4, 2006
INVENTOR(S) : Howard C. Kirsch It is certified that error appears in the above-identified patent and that said Letters Patent is hereby corrected as shown below:

| Column, Line | Reads | Should Read |
| --- | --- | --- |
| Column 1, Line 15 | "invention relates dynamic" | --invention relates to dynamic-- |
| Column 1, Line 67 | "complimentary" | --complementary-- |
| Column 2, Lines 45 and 45-46 | "complimentary" | --complementary-- |
| Column 3, Line 1 | "capacitor 114s to retain" | --capacitor 114 to retain-- |
| Column 3, Line 24 | "$V_T$ an access transistor" | --$V_T$ of an access transistor-- |
| Column 4, Line 3 | "disadvantages of a negative" | --disadvantages of negative-- |
| Column 4, Lines 50-51 | "voltage of more negative" | --voltage more negative-- |
| Column 4, Line 54 | "allow them to coupled $V_{CC}$" | --allow them to be coupled to $V_{CC}$-- |
| Column 5, Lines 10-11 | "this approach to has not met" | --this approach has not met-- |
| Column 5, Line 14 | "to reducing the sub threshold" | --to reduce the sub threshold-- |
| Column 6, Line 24 | "is able to provided" | --is able to provide-- |
| Column 6, Line 48 | "when they fabricated" | --when they are fabricated-- |
| Column 6, Line 61 | "as well the memory" | --as well as the memory-- |
| Column 7, Line 41 | "output node 216 isolated" | --output node 216 is isolated-- |

UNITED STATES PATENT AND TRADEMARK OFFICE
CERTIFICATE OF CORRECTION

PATENT NO. : 7,023,751 B2
APPLICATION NO. : 11/040959
DATED : April 4, 2006
INVENTOR(S) : Howard C. Kirsch It is certified that error appears in the above-identified patent and that said Letters Patent is hereby corrected as shown below:

| Column, Line | Reads | Should Read |
| --- | --- | --- |
| Column 7, Lines 57-58 | If the current $I_{OUT}$ supplied to the n-sense amplifier" | If the current $I_{OUT}$ is supplied to the n-sense amplifier-- |
| Column 8, Line 20 | "n-type regions n-type regions" | --n-type regions-- |
| Column 8, Line 37 | "controls is operation" | --controls its operation-- |
| Column 10, Line 14 | "from the arrays 290,292." | --from the arrays 290, 292.-- |
| Column 11, Line 61 | "corresponding the address" | --corresponding to the address-- |
| Column 12, Line 46 | "The DRAIVI of Claim 9" | --The DRAM of claim 9-- |
| Column 12, Line 51 | "complimentary" | --complementary-- |
| Column 13, Line 11 | "corresponding the address" | --corresponding to the address-- |
| Column 14, Line 3 | "complimentary" | --complementary-- |

UNITED STATES PATENT AND TRADEMARK OFFICE
CERTIFICATE OF CORRECTION

PATENT NO. : 7,023,751 B2
APPLICATION NO. : 11/040959
DATED : April 4, 2006
INVENTOR(S) : Howard C. Kirsch It is certified that error appears in the above-identified patent and that said Letters Patent is hereby corrected as shown below:

| Column, Line | Reads | Should Read |
|---|---|---|
| Column 16, Line 7 | "so that a sub threshold leakage the" | --so that a sub threshold leakage of the-- |

Signed and Sealed this

Twenty-seventh Day of May, 2008

JON W. DUDAS
*Director of the United States Patent and Trademark Office*